(12) United States Patent
Shih

(10) Patent No.: US 6,937,470 B2
(45) Date of Patent: Aug. 30, 2005

(54) PROCESSOR CASING WITH RADIATION STRUCTURE

(75) Inventor: Shoei-Yuan Shih, Taipei Hsien (TW)

(73) Assignee: Evserv Tech Corporation, Shijr (TW)

( * ) Notice: Subject to any disclaimer, the term of this patent is extended or adjusted under 35 U.S.C. 154(b) by 139 days.

(21) Appl. No.: 10/426,618

(22) Filed: May 1, 2003

(65) Prior Publication Data

US 2004/0218357 A1 Nov. 4, 2004

(51) Int. Cl.$^7$ .................................................. H05K 7/20
(52) U.S. Cl. ...................................... 361/695; 361/715
(58) Field of Search ........................ 165/80.3, 121–122; 361/688, 690, 694–695, 715; 454/184

(56) References Cited

U.S. PATENT DOCUMENTS

| 4,479,198 | A | * | 10/1984 | Romano et al. ............ 361/687 |
| 5,027,254 | A | * | 6/1991 | Corfits et al. ............... 361/694 |
| 5,193,050 | A | * | 3/1993 | Dimmick et al. ........... 361/694 |
| 5,912,801 | A | * | 6/1999 | Roy et al. .................... 361/690 |
| 6,169,656 | B1 | * | 1/2001 | Pei et al. ..................... 361/695 |
| 6,520,851 | B1 | * | 2/2003 | Shih ............................ 454/184 |

* cited by examiner

Primary Examiner—Gregory Thompson
(74) Attorney, Agent, or Firm—Birch, Stewart, Kolasch & Birch, LLP

(57) ABSTRACT

A radiation structure for servers is located inside a processor casing. The processor casing is divided in a first housing compartment and a second housing compartment. The first housing compartment houses data storage devices. The second housing compartment has a partition which has one side mounting a main board and forming air vents and other side mounting at least one radiation structure. The radiation structure has a shell forming air openings corresponding to the air vents. The shell further houses an air fan and a flow channeling structure for directly discharging heat generated by the main board through the air vents and the air openings.

5 Claims, 2 Drawing Sheets

US 6,937,470 B2

PROCESSOR CASING WITH RADIATION STRUCTURE

FIELD OF THE INVENTION

The present invention relates to a radiation structure for servers and particularly to a server radiation structure for discharging heat from the interior of a casing.

BACKGROUND OF THE INVENTION

The casings for industrial computers generally can be classified in 1U, 2U, 3U and 4U in terms of height. How to better utilize the interior space of the casing has been one of the heavily focused issues in the industry. In order to use the space more effectively, many vendors choose the casing of 3U specification to install memory units. In addition, in the opening end at the front half section of the processor casing, a plurality of redundant arrays of inexpensive disks (R.A.I.D.) are mounted in a juxtaposed or array manner. Power supplies and air fans are installed in the rear half section of the casing. As storage data volume is huge in many installations recently, the data storage devices are usually mounted vertically and in a juxtaposed fashion. Some can accommodate up to sixteen data storage devices. With so huge of disk driver arrays, and the main board and power supply in the rear end, a great amount of heat is generated inside the casing. A conventional approach to resolve heat dissipation is to straddle a transverse anchor dock in the middle portion of the processor casing (at the juncture of the disk driver array and the main board). The anchor dock has a plurality of air fans installed thereon that have air inlets to draw heated air generated by the data storage devices located at the front half section of the processor casing. Then air outlets of the air fans channel the heated air to the main board and central processor at the rear end of the casing. As the air fans-mounted on the anchor dock are high speed small fans, airflow being produced is not strong enough to discharge all the heat being generated outside the casing. Moreover, with the air fans channeling the heated air to the main board, the heated air is circulated inside the casing and cannot achieve real heat dissipation effect.

In order to effectively gather the heat and discharge outside the casing, some vendors have developed airflow channeling devices for servers. Some of these devices have airtight elements located on the periphery of the anchor dock of the air fan set to isolate the front end and the rear end of the server. The front end of the server has air vents leading to the exterior. The air outlet of the air fan set is connected to a channeling structure for channeling and converging airflow of the air fan set to suck in airflow at the front end of the server. The channeling structure channels and converges the airflow generated by the air fan set to disperse heat for the elements at the rear end of the server (main board and CPU). Thus airflow speed may increase to discharge heat outside the server. However, the structure set forth above still has problems remained to be overcome, notably:

1. The air fan set sucks in external cool air through the air vents at the front end, but in the mean time draws heated air generated by the data storage devices (disk drive array) to the main board at the rear end. When the number of the data storage devices increases, this portion of heat becomes very significant.
2. The airtight element is located above the main board for effectively discharging the heated air of the main board. However, the space above the main board is limited and cannot accommodate expansion equipment or replacing elements.
3. In order to accommodate the increased date storage devices, the disk drive arrays require additional controllers. The controllers are connected to the data storage devices and connected to the main board through cables. In such a configuration, the main board has to be located in other casing. As a result, total size of the processor casing cannot be shrunk as desired.

SUMMARY OF THE INVENTION

Therefore the primary object of the invention is to resolve the aforesaid disadvantages and to eliminate the shortcomings of prior art. The invention provides an improved radiation structure to effectively discharge heat generated by the main board (especially CPU) outside the casing.

Another object of the invention is to provide a configuration of the disk drive array and the main board that integrates the disk drive array, main board and power supply and the heat radiation structure in the same casing.

In order to achieve the foregoing objects, the invention divides the processor casing in a first housing compartment and a second housing compartment. The first housing compartment accommodates data storage devices. The second housing compartment has a partition. On one side of the partition, there are a main board and air vents. On other side of the partition, there is at least one radiation structure. The radiation structure has a shell which has air openings corresponding to the air vents. In addition, the shell houses an air fan and an airflow channeling structure to directly discharge heat generated by the main board through the air vents and air openings.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
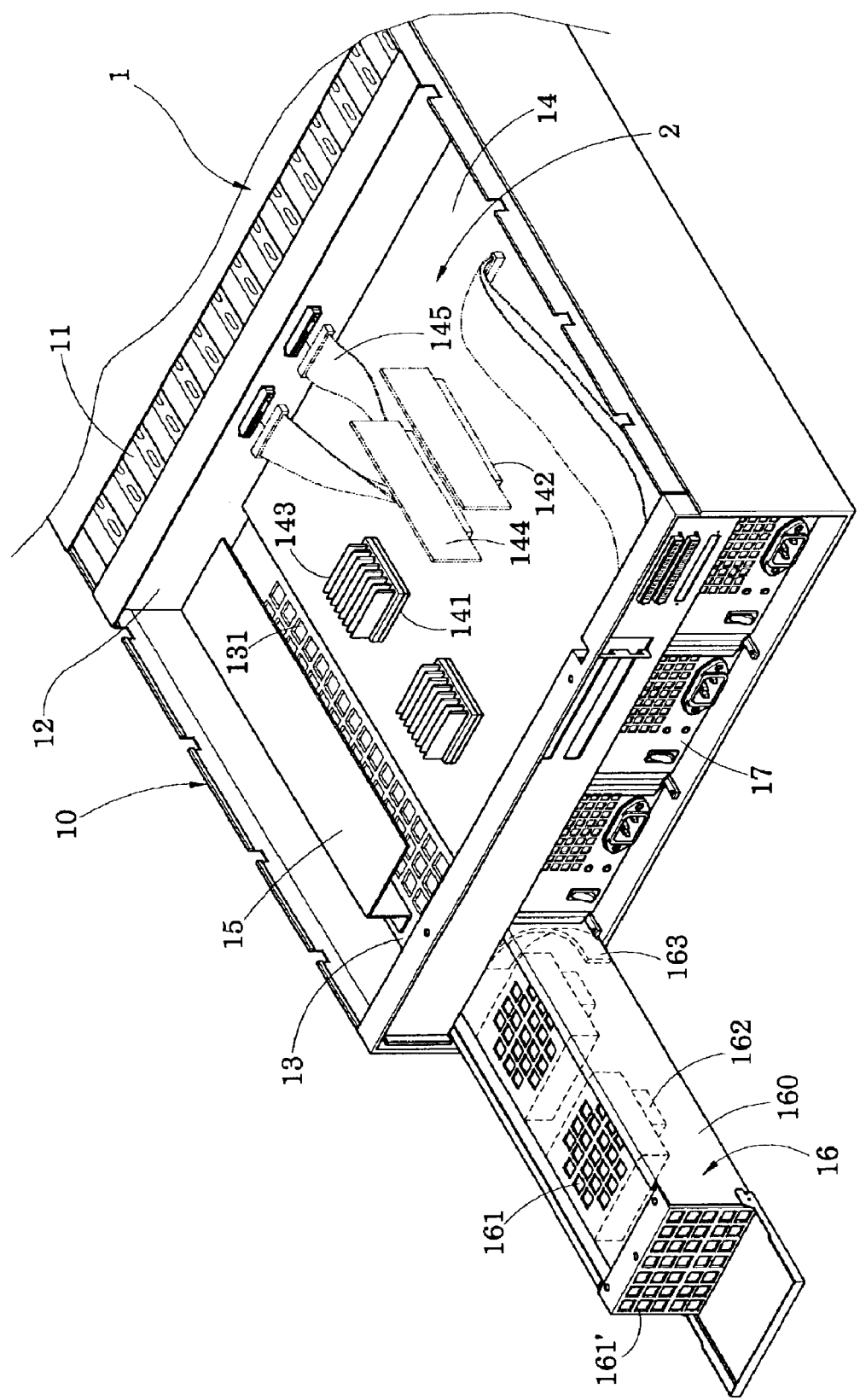
FIG. 1 is a perspective view of the present invention.

Please refer to FIG. 1 for the perspective view of the present invention. The radiation structure for servers according to the invention is located in a processor casing 10 which is divided in a first housing compartment 1 and a second housing compartment 2. The first housing compartment 1 is located at the front side of the casing 10 for holding a plurality of data storage devices 11 in a vertical and juxtaposed manner. There is a circuit board 12 located at the juncture of the first housing compartment 1 and the second housing compartment 2 to couple with the data storage devices 11 to form a disk drive array.

The second housing compartment 2 is located at the rear side of the processor casing 10 and has a transverse partition 13 straddled thereon. There is a main board 14 located above the partition 13. The main board 14 has a central processing unit (CPU) 141 and a connection port 142 mounted thereon. The CPU 141 has radiation fins 143 mounted thereon. The connection port 142 is coupled with a SCSI interface card 144 which in turn is connected to a flat cable 145 for linking the main board 14 to the circuit board 12 to control the disk drive array in the first housing compartment 1. The main board 14 may also be linked to other disk drive array through the flat cable 145. Below the partition 13, there are a radiation structure 16 and a plurality of power supplies 17. The partition 13 further fastens to a flow channeling plate 15 adjacent to the main board 14. The partition 13 also has a plurality of air vents 131 formed on the juncture of the flow channeling plate 15. The radiation structure 16 corresponds to the flow channeling plate 15 and the air vents 131. The radiation structure 16 is a retrieval fan set. It has a shell 160 with a plurality of air openings 161 and 161' formed thereon, and houses an air fan 162 and a flow channeling element 163.

Figure 2:
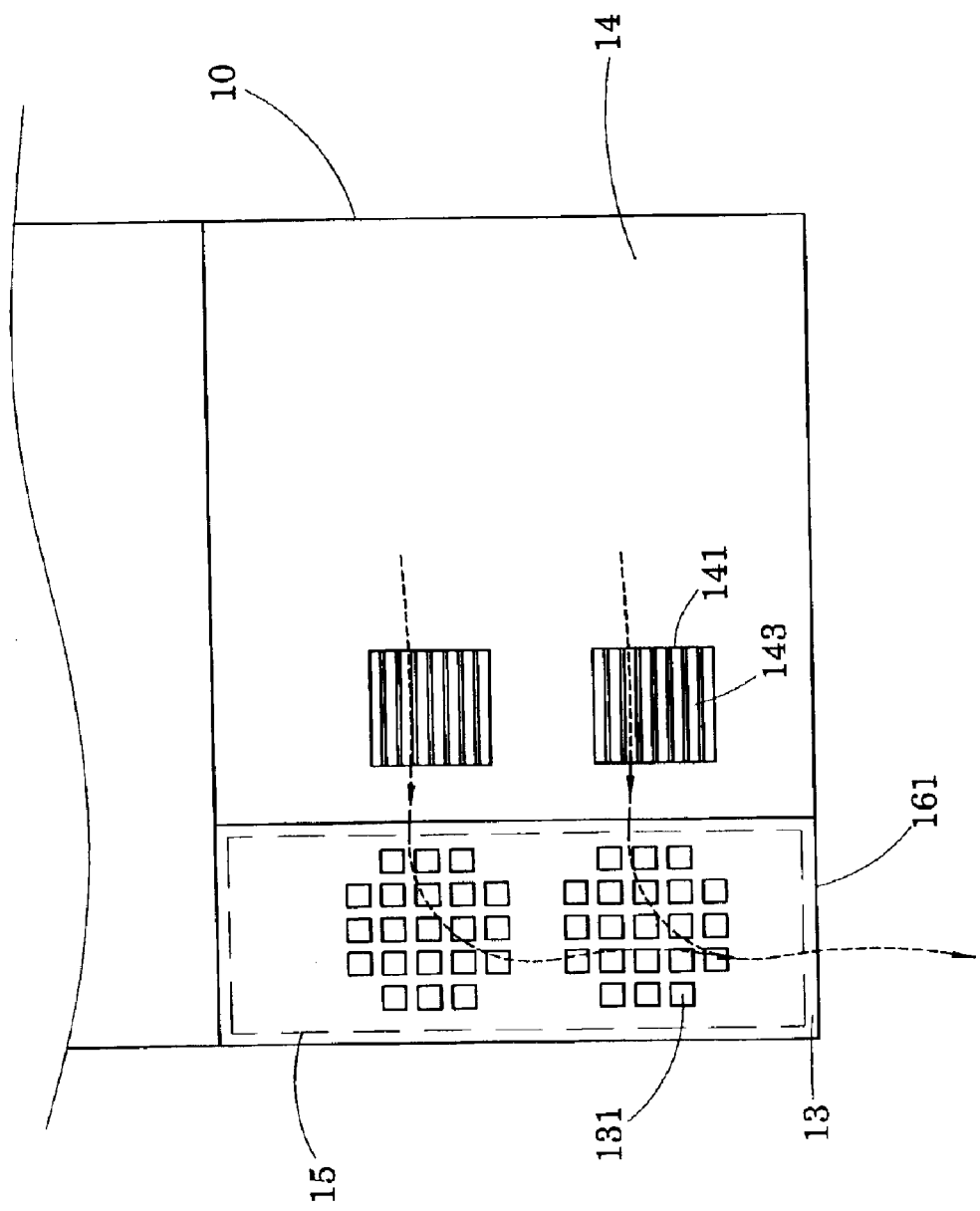
FIG. 2 is a schematic view of the present invention showing airflow flowing directions.

Please refer to FIG. 2 for the airflow directions of the invention. As shown in the drawing, heat generated by the CPU 141 on the main board 14 is firstly channeled upwards to the radiation fins 143 which increase heat dispersing area. Then the heat is transferred above the heat radiation structure 16 through the flow channeling plate 15. The air fan 162 of the radiation structure 16 rotates to draw heated air into the radiation structure 16 through the air vents 131 of the partition 13 and the air openings 161 of the shell 160. The heated air is channeled by the flow channeling element 163 and discharged outside the casing 10 through the air openings 161' at the front side so that heat generated by the CPU 141 can be discharged outside. The radiation structure 16 (also referring to U.S. Pat. No. 6,520,851 B1 granted to Applicant) of the invention is an improvement of an air fan structure that has the air fan 162 and the flow channeling element 163 to effectively discharge heated air outside the casing 10 so that heat is not circulated inside the casing 10. The main features of the invention includes:

1. The circuit board 12 divides the processor casing 10 in a first housing compartment 1 and a second housing compartment 2 to separate heat sources at the front end and the rear end of the processor casing 10 so that heat is not circulated inside the processor casing 10.
2. Heat generated by the CPU 141 of the main board 14 is directly channeled upwards to the radiation structure 16 through the flow channeling plate 15 and can be effectively discharged.
3. The width of the flow channeling plate 15 is corresponded to the CPU 141 located on the main board 14, thus does not affect expansion or element replacement of the main board 14.
4. It is not necessary to install the radiation structure 16 in the middle portion of the processor casing 10. Thus space utilization in the casing 10 is more effective. The disk drive array (data storage devices 11) and the main board 14 may be integrated in the same casing 10. And the radiation structure 16 is a retrieval air fan which makes replacement and repairs and maintenance easier.

What is claimed is:

1. A processor casing with a radiation structure, comprising:

a first housing compartment; and a second housing compartment which has a partition, a main board and air vents located one side of the partition and a radiation structure located on the other side of the partition, the radiation structure having a shell which has air openings corresponding to the air vents, the shell housing an air fan and a flow channeling structure for discharging heat generated by the main board through the air vents and the air openings.

2. The processor casing with the radiation structure of claim 1, wherein the first housing compartment and the second housing compartment are interposed by a circuit board which is linked to the main board for integrating data storage devices to form a disk drive array.

3. The processor casing with the radiation structure of claim 1, wherein the radiation structure is retrievable.

4. The processor casing with the radiation structure of claim 1, wherein the main board has a connection port coupling with a SCSI interface card to connect to a circuit board through a flat cable.

5. The processor casing with the radiation structure of claim 1, further comprising a flow channeling plate fastened onto the partition.

* * * * *